US008182719B2

(12) United States Patent
Lubomirsky

(10) Patent No.: US 8,182,719 B2
(45) Date of Patent: May 22, 2012

(54) PYROELECTRIC COMPOUND AND METHOD OF ITS PREPARATION

(75) Inventor: Igor Lubomirsky, Petach Tikva (IL)

(73) Assignee: Yeda Research and Development Company Ltd., Rehovot (IL)

( * ) Notice: Subject to any disclaimer, the term of this patent is extended or adjusted under 35 U.S.C. 154(b) by 997 days.

(21) Appl. No.: 10/560,107

(22) PCT Filed: Jun. 10, 2004

(86) PCT No.: PCT/IL2004/000501
§ 371 (c)(1),
(2), (4) Date: Dec. 9, 2005

(87) PCT Pub. No.: WO2004/109749
PCT Pub. Date: Dec. 16, 2004

(65) Prior Publication Data
US 2006/0118765 A1    Jun. 8, 2006

Related U.S. Application Data

(60) Provisional application No. 60/477,400, filed on Jun. 11, 2003.

(51) Int. Cl.
*H01B 1/00* (2006.01)
(52) U.S. Cl. ............... 252/500; 252/62.9 R; 204/487; 257/65; 257/64; 257/83; 347/55; 365/117
(58) Field of Classification Search ............... 252/62.51, 252/500, 62.9 R; 422/94; 428/323, 690, 428/697, 461; 29/25.35; 310/313 R; 73/862.392; 307/400; 361/233; 423/598; 204/487; 257/83, 257/336.1, 338.3, 57, 64; 347/55; 365/117; 438/166
See application file for complete search history.

(56) References Cited

U.S. PATENT DOCUMENTS

| | | | | |
|---|---|---|---|---|
| 3,604,933 A * | 9/1971 | Cross et al. | ............... | 250/336.1 |
| 3,877,308 A * | 4/1975 | Taylor | ........................ | 307/400 |
| 3,930,240 A * | 12/1975 | Hadni et al. | ................ | 365/117 |
| 3,999,069 A * | 12/1976 | Taylor et al. | ............... | 250/338.3 |
| 4,067,056 A * | 1/1978 | Taylor et al. | ............... | 361/233 |
| 4,089,034 A * | 5/1978 | Taylor et al. | ............... | 361/233 |
| 4,500,397 A * | 2/1985 | Mori | ........................ | 204/487 |
| 4,590,507 A * | 5/1986 | Capasso et al. | ............ | 257/185 |
| 4,601,883 A * | 7/1986 | Sekido et al. | ................ | 422/94 |
| 4,606,906 A * | 8/1986 | Ritter et al. | ................ | 423/598 |
| 4,869,840 A | 9/1989 | Osbond et al. | | |
| 5,127,982 A * | 7/1992 | Kotake | ................ | 252/62.9 R |
| 5,342,648 A * | 8/1994 | MacKenzie et al. | ....... | 427/126.3 |
| 5,426,340 A * | 6/1995 | Higaki et al. | ............. | 310/313 R |

(Continued)

FOREIGN PATENT DOCUMENTS

DE      100 28 022 A1   12/2001

(Continued)

OTHER PUBLICATIONS

Jaffe et al., "Piezoelectric Ceramics", Academic Press, Unknown Month 1971, pp. 70-74.*

(Continued)

*Primary Examiner* — Khanh Tuan Nguyen
(74) *Attorney, Agent, or Firm* — Browdy and Neimark, PLLC

(57) ABSTRACT

A novel pyroelectric compound is presented. The compound is inorganic, quasi-amorphous oxide compound of a metal, mixture of metals or semiconducting element.

38 Claims, 3 Drawing Sheets

U.S. PATENT DOCUMENTS

| | | | | |
|---|---|---|---|---|
| 5,472,777 | A * | 12/1995 | Kineri et al. | 428/323 |
| 5,483,842 | A * | 1/1996 | Foreman | 73/862.392 |
| 5,504,330 | A * | 4/1996 | Summerfelt et al. | 250/338.3 |
| 5,572,052 | A * | 11/1996 | Kashihara et al. | 257/295 |
| 5,619,234 | A * | 4/1997 | Nagato et al. | 347/55 |
| 5,989,395 | A * | 11/1999 | Tomozawa et al. | 204/192.15 |
| 6,048,622 | A * | 4/2000 | Hagood et al. | 428/461 |
| 6,692,569 | B2 * | 2/2004 | Roeder et al. | 117/104 |
| 6,803,122 | B2 * | 10/2004 | Shirakawa et al. | 428/690 |
| 2002/0071969 | A1 * | 6/2002 | Qiu et al. | 428/697 |
| 2002/0117647 | A1 * | 8/2002 | Roeder et al. | 252/62.51 R |
| 2002/0177008 | A1 * | 11/2002 | Shirakawa et al. | 428/690 |
| 2003/0033700 | A1 * | 2/2003 | Takeuchi et al. | 29/25.35 |
| 2003/0085426 | A1 * | 5/2003 | Kondo et al. | 257/347 |
| 2003/0089943 | A1 * | 5/2003 | Duncombe et al. | 257/310 |
| 2004/0056291 | A1 * | 3/2004 | Takashima | 257/295 |
| 2004/0238861 | A1 * | 12/2004 | Hwang et al. | 257/295 |
| 2006/0118795 | A1 * | 6/2006 | Araki | 257/83 |

FOREIGN PATENT DOCUMENTS

JP 11-282383 * 10/1999

OTHER PUBLICATIONS

Ong et al., "Alignment of nematic liquid crystals by inhomogeneous surfaces", J. Appl. Phys. 57(2), Jan. 15, 1985, pp. 186-192.*

D. McClure and J. Crowe, "Characterization of Amorphous Barium Titanate Films Prepared by rf Sputtering," J. Vac. Sci. Technol., 16(2), Mar./Apr. 1979, pp. 311-313.*

S. Li. J. A. Eastman, Z. Li, C. M. Foster, R. E. Newnham, and L. E. Cross, "Size effects in nanostructureed ferroelectrics", Phys. Lett. A 1996, 212, 341-346.

N. A. Pertsev, A. G. Zembilgotov, and A. K. Tagantsev "Effect of Mechanical Boundary Conditions on Phase Diagrams of Epitaxial Ferroelectric Thin Films", Phys. Rev. Lett. 1998, 80, 1998-1991.

T. Feng and J. M. Cowley, "Thickness dependence of ferroelectric domains in thin crystalline films", Appl. Phys. Lett. 1994, 65, 1906-1908.

M. H. Frey and D. A. Payne, "Grain-size effect on structure and phase transformations for barium titanate", Phsy. Rev. B 1996, 54, 3158-3167.

G. Ayton, M. JU. P. Gingras, and G. N. Patney, "Orientatinal Ordering on Spatially Disordered Dipolar Systems", Phys. Rev. Lett. 1995, 75, 2360-2363.

P. J. Groout, N. H. March, and Y. Ohmura, "Low-temperature behavior of Pyroelectric glasses", Appl. Phys. Lett. 1978, 32, 453-454.

A. M. Glass, M. E. Lines, K. Nassau, and J. W. Shiever, "Anomalous dielectric behavior and reversible pyroelectricity in roller-quenched $LiNbO_3$ glass", Appl. Phys. Lett. 1977, 31, 249-251.

Y. H. Xu, C. H. Cheng, and J. D. Mackenzie, "Electrical characterizations of polycrystalline and amorphous thin films of $Pb(Zr_xT_{1-x})O_3$ and $BatTiO_3$ prepared by sol-gel technique", J. Non-Cryst Silids 1994, 176, 1-17.

K. Sreenivas, A. Mansingh, and M. Sayer, "Structural and electrical properties of rf-sputtered amorphous barium titanate thin films", J. Appl. Phys. 1987, 62, 4475-4481.

B. S. Chiou and M. C. Lin, "Electrical properties of amorphous barium titanate films prepared by low power r.f. sputtering", Thin Solid Films 1994, 248, 247-252.

W. T. Liu, S. T. Lakshmikurnar, D. B. Knorr, E. J. Rymaszewski, T. M. Lu, and H. Bakhru, "Thermally stable amorphous $Ba_xTi_{2-x}O_y$ thin films", Apply. Phys. Lett. 1995, 66, 809-811.

M. N. Kamalasanan, N. D. Kumar, and S. Chandra, "Structural and microstructural evolution of barium titanate thin films deposited by the dol-gel process", J. Apply. Phys. 1994, 76, 4603-4609.

A. A. Lipovskii, D. K. Tagantsev, A. A. Vetrov, and O. V. Yanush, "Raman spectroscopy and the origin of electrooptical Kerr phenomenon in niobium alkali-silicate glasses", Optical Materials 2003, 21, 749-757.

A. K. Tagantsev, "Electrical polarization in Crystals and Its Response to Thermal and Elastic Perturbations", Phase Transitions 1991, 35, 119-203.

W. L. Warren, G. E. Pike, K. Vanheusden, D. Dimos, B. A. Tuttle, and J. Robertson, ":Defect-dipole alignment and tetragonal strain in ferroelectrics", J. Appl. Phys. 1996, 79, 9250-9257.

D. M. Kozuch, M. Stavola, S. J. Spector, S. J. Pearton, and J. Lopata, "Symmetry, stress alignment, and reorientation kinetics of the $Si_{As}$—H complex in GaAs", Phys, Rev. B 1993, 48, 8751-8756.

L. Nam Yang, T. Sekine, Y. Ito, and K. Uchino, "Deposition Profile of RF-Magnetron-Sputtered $BaTiO_3$ Thin films", Jpn. J. Appln. Phys. 1. 1994, 33, 1484-1488.

G. G. Stoney, "The Tension of Metallic Films deposited by Electrolysis", Proc. R. Soc. London 1909, A82, 172-175.

A. G. Chynoweth, "Dynamic Method for Measuring the Pyroelectric Effect with Special Reference to Barium Titanate", Appl. Phys. Lett. 1956, 27, 78-84.

B. R. Holeman, "Sinusoidally Modulated Heat Flow And The Pyroelectric Effect", Infrared Physics 1972, 12, 125-135.

N. Stavitski, V. Lyahovitskaya, J. Nair, I. Zon, R. Popovitz-Biro, E. Wachtel, Y. Feldman, and I. Lubomirsky, "Substrate-free crystallization of distorted Hexagonal barium titanate thin films", Appl. Phys. Lett. 2002, 81, 4177-4179.

O. Kolosove, A. Gruverman, J. Hatano, K. Takahashi, and H. Tokumoto, "Nanascale Visualization and Control of Ferroelectric Domains by Atomic Force Microscopy", Phys. Rev. Lett. 1995, 74, 4309-4312.

Robertson, J. Warren, "Band states and shallow hole traps in $Pb(Zr,Ti)O_3$ ferroelectrics", W.L. & Tuttle, B.A. in Journal of Applied Physics 3975-3980-3980 (1995).

Ayton, G. Gingras, M.J.P. & Patey, G.N., "Ferroelectric amd dipolar glass phases of noncrystalline systems". Phys. Rev. E 56, 562-570 (1997).

Baghat, A.A. & Kamel, T.M., "Possible observation of a glassy ferroelectric: $Bi_{1.8}Pb_{0.3}Sr_2Ca_2Cu_{2.8}K_{0.2}O_z$" Phys. Rev. B 63, art. No.-012101-1-012101-4 (2001).

Lubomirsky et al "Observation of self-poling in BaTiO3", Journal of Applied Physics, vol. 85(9), pp. 6690-6694, May 1999 (Abstract only).

* cited by examiner

PYROELECTRIC COMPOUND AND METHOD OF ITS PREPARATION

FIELD OF THE INVENTION

This invention relates to pyroelectric compounds, a process for their preparation and devices comprising them.

LIST OF REFERENCES

The following references are considered to be pertinent for the purpose of understanding the background of the present invention:
[1] S. Li, J. A. Eastman, Z. Li, C. M. Foster, R. E. Newnham, and L. E. Cross, *Phys. Lett. A* 1996, 212, 341.
[2] N. A. Pertsev, A. G. Zembilgotov, and A. K. Tagantsev, *Phys. Rev. Lett.* 1998, 80, 1988.
[3] T. Feng and J. M. Cowley, *Appl. Phys. Lett.* 1994, 65, 1906.
[4] M. H. Frey and D. A. Payne, *Phys. Rev. B* 1996, 54, 3158.
[5] G. Ayton, M. J. P. Gingras, and G. N. Patey, *Phys. Rev. Lett.* 1995, 75, 2360.
[6] P. J. Grout, N. H. March, and Y. Ohmura, *Appl. Phys. Lett.* 1978, 32, 453.
[7] A. A. Bahgat and T. M. Kamel, *Phys. Rev. B* 2001, 63, art. no.
[8] A. M. Glass, M. E. Lines, K. Nassau, and J. W. Shiever, *Appl. Phys. Lett.* 1977, 31, 249.
[9] Y. H. Xu, C. H. Cheng, and J. D. Mackenzie, *J Non-Cryst Solids* 1994, 176, 1.
[10] B. K. Tanner, *X-ray diffraction topography*,, Pergamon Press, Oxford 1976.
[11] K. Sreenivas, A. Mansingh, and M. Sayer, *J. Appl. Phys.* 1987, 62, 4475.
[12] B. S. Chiou and M. C. Lin, *Thin Solid Films* 1994, 248, 247.
[13] W. T. Liu, S. T. Lakshmikumar, D. B. Knorr, E. J. Rymaszewski, T. M. Lu, and H. Bakhru, *Appl. Phys. Lett.* 1995, 66, 809.
[14] M. N. Kamalasanan, N. D. Kumar, and S. Chandra, *J. Appl. Phys.* 1994, 76, 4603.
[15] A. A. Lipovskii, D. K. Tagantsev, A. A. Vetrov, and O. V. Yanush, *Optical Materials* 2003, 21, 749.
[16] D. J. Johns, *Thermal stress analysis*, Pergamon, Oxford 1965.
[17] A. K. Tagantsev, *Phase Transitions* 1991, 35, 119.
[18] W. L. Warren, G. E. Pike, K. Vanheusden, D. Dimos, B. A. Tuttle, and J. Robertson, *J. Appl. Phys.* 1996, 79, 9250.
[19] D. M. Kozuch, M. Stavola, S. J. Spector, S. J. Pearton, and J. Lopata, *Phys. Rev. B* 1993, 48, 8751.
[20] L. Nam-Yang, T. Sekine, Y. Ito, and K. Uchino, *Jpn. J. Appl. Phys.* 1. 1994, 33, 1484.
[21] R. M. A. Azzam, *Ellipsometry and polarized light*, North-Holland, Amsterdam 1987.
[22] G. G. Stoney, *Proc. R. Soc. London* 1909, A82, 172.
[23] A. G. Chynoweth, *Appl. Phys. Lett.* 1956, 27, 78.
[24] B. R. Holeman, *Infrared Physics* 1972, 12, 125.
[25] N. Stavitski, V. Lyahovitskaya, J. Nair, I. Zon, R. Popovitz-Biro, E. Wachtel, Y. Feldman, and I. Lubomirsky, *Appl. Phys. Lett.* 2002, 81, 4177.
[26] M. E. Lines and A. M. Glass, *Principles and applications of ferroelectrics and related materials*, Clarendon Press, Oxford 2001.
[27] O. Kolosoy, A. Gruverman, J. Hatano, K. Takahashi, and H. Tokumoto, *Phys. Rev. Lett.* 1995, 74, 4309.
[28] Robertson, J. Warren, W. L. & Tuttle, B. A. in *Journal of Applied Physics* 3975-3980 (1995).
[29] Ayton, G. Gingras, M. J. P. & Patey, G. N. Ferroelectric and dipolar glass phases of noncrystalline systems. *Phys. Rev. E* 56, 562-570 (1997).
[30] Baghat, A. A. & Kamel, T. M. Possible observation of a glassy ferroelectric: $Bi_{1.8}Pb_{0.2}Sr_2Ca_2Cu_{2.8}K_{0.2}Oz$. *Phys. Rev. B* 63, art. no.—012101 (2001).
[31] DE 10028022;
[32] U.S. Pat. No. 5,504,330.

BACKGROUND OF THE INVENTION

Pyroelectricity is a property of certain crystals consisting of polarization developed in a crystal by an inequality of temperature. Spontaneous or stress-induced polarization, signifyig pyroelectricity and piezoelectricity respectively, can appear in ionic solids solely due to a non-centrosymmetrical spatial distribution of ions in a polar crystalline structure. Although theory does not impose strict limitations on the size of a polar crystallite[1,2], the magnitude of pyroelectric and piezoelectric effects of some ceramics, particularly $BaTiO_3$, rapidly decrease as grain size diminishes to a few nanometers[1,3,4].

Determination of the minimal number of periodically arranged unit cells for which a crystal retains pyroelectric and piezoelectric properties has become increasingly important due to the rapid incorporation of these materials into nanometer-scale devices.

As disclosed in U.S. Pat. No. 5,504,330, pyroelectric properties of a thin film made of perovskite materials may be enhanced, by the addition of lead to an original perovskite material having an original ferroelectric critical grain size, and then forming a layer of the lead enhanced perovskite material having an average grain size less than the original ferroelectric critical grain size. The remanent polarization of the layer appeared to be substantially greater than the remanent polarization of the original perovskite material.

Thin $BaTiO_3$ ferroelectric films are important for a number of applications such as high charge density capacitors, ferroelectric memory, and microwave and optoelectronic devices. However, integration of $BaTiO_3$ into Si microfabrication technology is hindered by the high chemical reactivity of $BaTiO_3$ with respect to Si. Therefore, despite the small misfit between the lattice parameter of Si and inter-plane distance of $BaTiO_3$, epitaxial growth of $BaTiO_3$ on Si always requires intermediate buffer layers.

DE 10028022 discloses the production of highly ordered low molecular inorganic thin action layers at low temperature on silicon chips in pyroelectric detectors. Such production comprises applying an action layer made from a ferroelectric, pyroelectric or piezoelectric material to a substrate with a highly ordered polytetrafluoroethylene coating whereby the action layer is ordered through the polytetrafluoroethylene substrate.

It is also known that pyro- and piezo-electric effects may exist in structures that lack the spatial periodicity inherent for ionic crystals, but composed of polar molecules with directional ordering. An example of such a material is a nematic liquid crystal. Spontaneous or stress induced dipole ordering without fine-tuned positional order is theoretically possible in ionic solids[5] as well; however only indirect experimental evidence supporting this theory has been presented so far[6-9].

SUMMARY OF THE INVENTION

The present invention provides for novel pyroelectric (and consequently piezoelectric) compound and a method of its preparation.

The compound of the present invention, while being inorganic, shows clear pyroelectric and piezoelectric properties despite the lack of spatial periodicity inherent to ionic crystals.

The inventor has surprisingly found that a quasi-amorphous compound having a relatively low dielectric constant and a relatively high pyroelectricity may be produced, by subjecting an amorphous compound to a mechanical strain, where the mechanical strain does not promote the formation of crystallites within the quasi-amorphous compound. The compound obtained in the present invention is thus characterized by the advantageous features of amorphous compounds (e.g., low dielectric constant low production costs) and the advantageous features of crystalline compounds (e.g., pyroelectricity and piezoelectricity). The pyroelectric and piezoelectric effects of the quasi-amorphous compound of the invention may be attributed to a spontaneous local dipole ordering, which is usually observed in crystalline solids but not in amorphous ones.

The term "quasi amorphous compound" should be construed herein as a compound which is a non crystalline ionic solid having a macroscopic polarization. The polarization manifests itself as pyroelectric effect.

Thus, according to the first aspect thereof, the present invention provides a novel pyroelectric compound having an amorphous ionic solid structure with directional polar ordering. More specifically, the present invention provides an inorganic, quasi-amorphous oxide compound of a metal, mixture of metals or semiconducting element, the compound having pyrolelectric properties.

According to a preferred embodiment of the invention, the oxide compound has the formula $(A_xB_{1-x})_pO_n$, wherein A and B are independently selected from transitions metals, elements of Group IVA of the periodic table, alkali metals, alkali earth metals and rare earth metals; x has values of between 0 to 1; p is an integer having the values 1, 2 or 3; and n is an integer having the value of 1, 2, 3 or 4. Preferably, A is a transition metal or an element of Group IVA of the periodic table; x is 1 and p is 2. More preferably, the compound is selected from. $SiO_2$ and $TiO_2$.

According to another preferred embodiment of the invention, the compound has the formula $(A_xB_{1-x})(C_yD_{1-y})O_n$ wherein A and B are independently selected from alkali metals, alkali earth metals, rare earth metals and elements of Group IVA of the periodic table; C and D are independently selected from transition metals and alkali earth metals; x and y have values of between 0 to 1; and n is an integer having a value between 1 to 10. Preferably, n has a value of 1, 2, 3 or 4 and more preferably n is 1, 2 or 3.

According to a preferred embodiment of the invention, A and B are independently selected from Ba, Sr, Ca, Pb, La, Eu, Li, Na, K and Cs; C and D are independently selected from Ti, Zr, Nb, Ta, Sc, Mg and V; and n is 3.

Preferably, A and B are independently selected from Ba, Sr, Ca, Pb, La and Eu.

According to another preferred embodiment, A and B are independently selected from Li, Na, K and Cs.

Similarly, C and D are independently selected from Ti and Zr. According to another preferred embodiment, C and D are independently selected Nb, Ta, Sc, Mg and V.

According to a further preferred embodiment, in the quasi-amorphous compound of the invention, y=0, thus obtaining a compound of the formula $(A_xB_{1-x})DO_3$ having pyroelectric properties, wherein A, B, D and x have the meanings defined above.

Specific examples of pyroelectric compounds according to the present invention are $BaTiO_3$, $CaTiO_3$, $PbTiO_3$, $Pb(ZrTi)$ $O_3$, $Pb(Zr_{0.35}Ti_{0.65})O_3$, $(PbCa)TiO_3$, $(PbLa)(ZrTi)O_3$, $PbLaTiO_3$, $Pb(ScTa)O_3$, $Pb(ScNb)O_3$, $Pb(MgNb)O_3$, $SrTiO_3$, $(Sr_{0.65}Ba_{0.35})TiO_3$, $(Ba_{0.70}Sr_{0.30})TiO_3$ and $EuTiO_3$. Preferably, the compound is selected from $BaTiO_3$, $PbTiO_3$ and $SrTiO_3$. More preferably, the compound is $BaTiO_3$.

The compound of the present invention has a pyroelectricity in the range from about $10^{-12}$ C/(cm²×K) to about $10^{-7}$ C/(cm²×K).

According to another aspect, the present invention provides a process for preparing pyroelectric compound, comprising applying a mechanical strain to a substantially amorphous compound of the formula $(A_xB_{1-x})(C_yD_{1-y})O_3$ as defined above, the mechanical strain being such as to prevent crystallization of the compound, thereby obtaining inorganic quasi-amorphous compound having pyroelectric properties. The effect of mechanical strain can be achieved by subjecting the compound to an external field such as a temperature gradient or an electrical field. In a preferred embodiment, the substantially amorphous compound has the formula $(A_xB_{1-x})DO_3$, wherein A, B, D and x have the meanings defined above In addition, the present invention provides an inorganic quasi-amorphous compound of the formula $(A_xB_{1-x})(C_yD_{1-y})O_3$ as defined above, preparable by the process of the present invention.

The present invention according to its yet another aspect provides a device comprising the compound of the present invention which can be operable as a sensor for sensing external fields including temperature, magnetic and electric field.

The present invention also provides an acoustic wave propagation channel, as well as a birefringent medium, formed by the compound of the present invention.

The compound of the present invention can be formed as a layer coating on a substrate, which can be any substance of a kind that does not cause a rapid crystallization of the amorphous compound, such as Si, $SiO_2$ and glass.

DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE INVENTION

Figure 1:
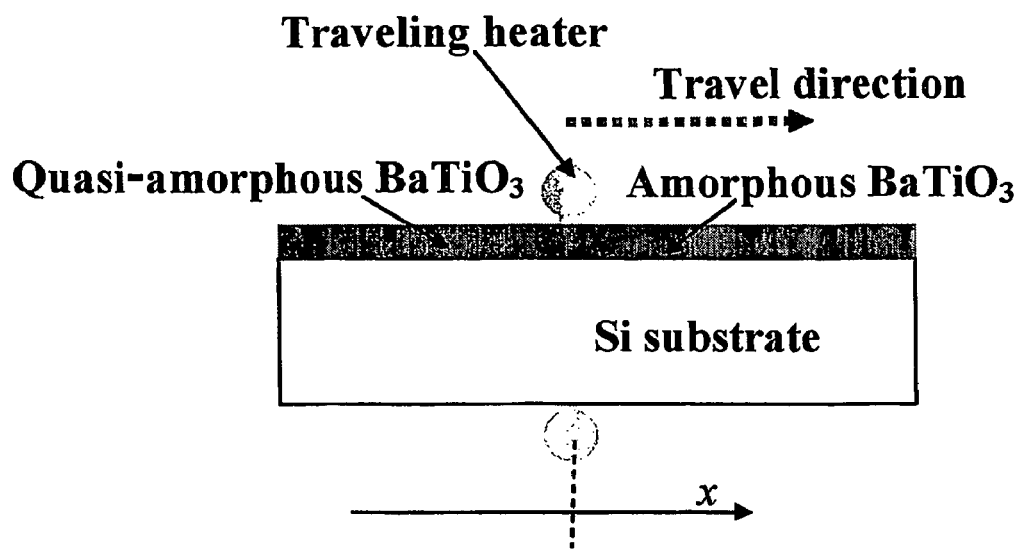
FIG. 1 is a scheme illustrating the preparation of quasi-amorphous $BaTiO_3$ films by passing them through a steep unidirectional temperature gradient.

The present invention provides for a novel inorganic non-crystalline oxide compound having pyroelectric and piezolectric properties, and a method of preparation of this compound.

The method of the present invention comprises subjecting sputtered amorphous compound films to a mechanical strain. This can be implemented by passing the film through a steep temperature gradient. The temperature gradient has to be carefully controlled and to be such as to prevent crystallization of the amorphous compound, thereby obtaining highly stressed amorphous films.

Suitable amorphous compound for use in the process of the present invention may be any compound that possesses piezoelectric and pyroelectric properties in its crystalline form. A specific, non-limiting example of such compound is BaTiO$_3$.

In the process of the present invention, a polar ionic solid is produced by alignment of local dipoles of the molecules in an amorphous compound by applying a mechanical strain. Any method that creates a mechanical strain, such as electric field, temperature gradient, etc., would be suitable for achieving alignment of the local dipoles thereby forming a macroscopic dipole moment.

The highly stressed amorphous films obtained by the process of the present invention have pyroelectric and piezoelectric properties as clearly demonstrated in the experimental section below. In addition, the obtained films have a low dielectric constant (~30) and a cheap producing cost.

Thus, the obtained films represent a polar ionic solid without spatial periodicity and therefore, should be henceforth referred to as quasi-amorphous.

Without being bound to theory, a possible mechanism for the formation of polarity in the obtained quasi-amorphous BaTiO$_3$ thin films probably includes sharp increase of the dielectric constant during the transformation of the amorphous into the quasi-amorphous films and implies molecular grouping, which is formation of crystal motifs. Crystal motifs earlier observed in electro-optic glasses can be viewed as regions with a local crystal-like symmetry that gradually vanishes within 2-3 coordination spheres[15].

The steep temperature gradient during formation of the quasi-amorphous films generates a gradient of mechanical strain[16] that poles the films due to the flexoelectric effect[17]. The strain gradient has two components: in-plane (along the temperature gradient), and out-of-plane (a result of the clamping caused by the cold part of the film)[16]. The latter component is responsible for the out-of-plane orientation of the crystal motifs in the films. Thus, if the crystal motifs are polar, their partial orientation creates a sense of polarity in a quasi-amorphous film as a whole. Once formed, the motifs cannot change their orientation due to the large in-plane compressive stress[18,19].

A possible mechanism that may provide considerable thermal stability for the obtained quasi-amorphous thin films of BaTiO$_3$ is that nucleation of crystalline BaTiO$_3$ preferably occurs in a low-density intermediate phase that forms as a result of a large volume expansion of the as-deposited amorphous phase. Thus, formation of a low-density intermediate phase is seen as a precondition for nucleation and crystallization. In the absence of external mechanical constraints volume expansion is unobstructed and nucleation proceeds freely.

In a thin film clamped by a substrate, volume expansion is restricted and nucleation may be completely suppressed. This indeed occurs if an as-deposited amorphous film is pulled through a temperature gradient. The obtained quasi-amorphous phase retains thermal stability as long as the mechanical constraints are in place.

According to the mechanism suggested above, two preconditions for the formation and stability of the quasi-amorphous phase are required: a) small enthalpy of crystallization; and b) large volume expansion upon heating prior to crystallization.

Thus as-deposited films of amorphous ionic oxides which satisfy these requirements could potentially form the quasi-amorphous state if pulled through a temperature gradient. Variation of mechanical constraints may produce an indefinitely large number of quasi-amorphous phases with different density.

Combination of strong pyroelectric and piezoelectric effects with low is dielectric constant indicates that quasi-amorphous compounds of the present invention are very promising for practical applications. It is important to note that the ratio of pyroelectric coefficient/dielectric constant for quasi-amorphous BaTiO$_3$, as demonstrated in the experimental section is close to or surpasses that of LiNbO$_3$, making it very attractive for pyroelectric detector applications. The compound of the present invention can thus be used as sensor device for sensing an external temperature or electric field to which the compound is exposed, as an acoustic wave propagation channel (being thus useful as a constructional component of a phone device), as a birefringent medium in optical devices, etc.

EXPERIMENTAL

Reference is now made to FIG. 1 illustrating the preparation of quasi-amorphous BaTiO$_3$. Amorphous 150-250 nm thick BaTiO$_3$ layers were deposited by radio frequency (RF) magnetron oxygen plasma sputtering[20] on highly conductive (As-doped, 1-5 mΩ·cm) (100) Si wafers. As-deposited films of BaTiO$_3$ were passed at a rate of 2-5 mm/hr through a narrow (15 mm) hot zone in a vertical furnace with peak temperature of T$_{max}$=650° C. The temperature distribution, T (in ° C.), as a function of distance, x (mm), from the hottest point of the zone was adjusted to follow the cubic parabola form:

$$T(x) \approx T_{max} - 0.14|x|^3,$$

for |x|<15 mm.

For the control experiment, some as-deposited films were heated under isothermal conditions at 600° C. for 60 min.

Ellipsometry measurements of the residual layers[21] on the Si wafer after BaTiO$_3$ was selectively stripped off suggesting that no significant chemical reaction between Si and BaTiO$_3$ occurred during film deposition and heat treatment. BaTiO$_3$ was selectively stripped off with a 15% solution of (NH$_3$)$_2$Ce(NO3)$_6$. Silicates and silicon oxide are not soluble in (NH$_3$)$_2$Ce(NO$_3$)$_6$ and therefore would be easily detected by ellipsometry if formed at the Si/BaTiO$_3$ interface. This method cannot distinguish between the oxide grown due to the chemical reaction during the heat treatment and the oxide produced by (NH$_3$)$_2$Ce(NO$_3$)$_6$ (~5 nm) during the film stripping.

As-deposited BaTiO$_3$ films were stress-free (<±30 MPa) with refractive index in the range of n$_\perp$=1.97÷2.02, and a very small in-plane-out-of-plane birefringence of n$_\parallel$−n$_\perp$=−(0.002÷0.008), confirming film isotropy. The refractive index and birefringence were deduced from ellipsometry with fixed wavelength of λ=634 nm at four different incidence angles (55-70°).

A compressive stress of $\sigma_e$=2.0-2.2 GPa was developed in the films passed through the temperature gradient. The stress was measured by the substrate curvature method[22]. The refractive index of these films decreased to $n_\perp$=1.89÷1.94 but the birefringence grew to $n_\parallel - n_\perp$=0.03÷0.07, corroborating the existence of high in-plane compressive stress.

All prepared films were analyzed by X-Ray powder diffraction (XRD, Rigaku corp. $CuK_\alpha$=1.5405Θ-2Θ mode and the pole-figure technique) and by transmission electron microscopy (TEM Phillips CM-120) combined with electron diffraction(ED). Scanning electron microscopy (Philips XL30 ESEM-FEG) was employed to image film surfaces and cross sections.

The inventor has further investigated three types of films of the as-deposited amorphous $BaTiO_3$:

1) dense, smooth and uniform films;
2) films with a large number of structural defects and/or large surface roughness; and
3) films deposited on a MgO seeding layer.

The conclusion of such experiments was that quasi-amorphous state forms preferably if dense, smooth and uniform films are pulled through the temperature gradient.

Figure 2A:
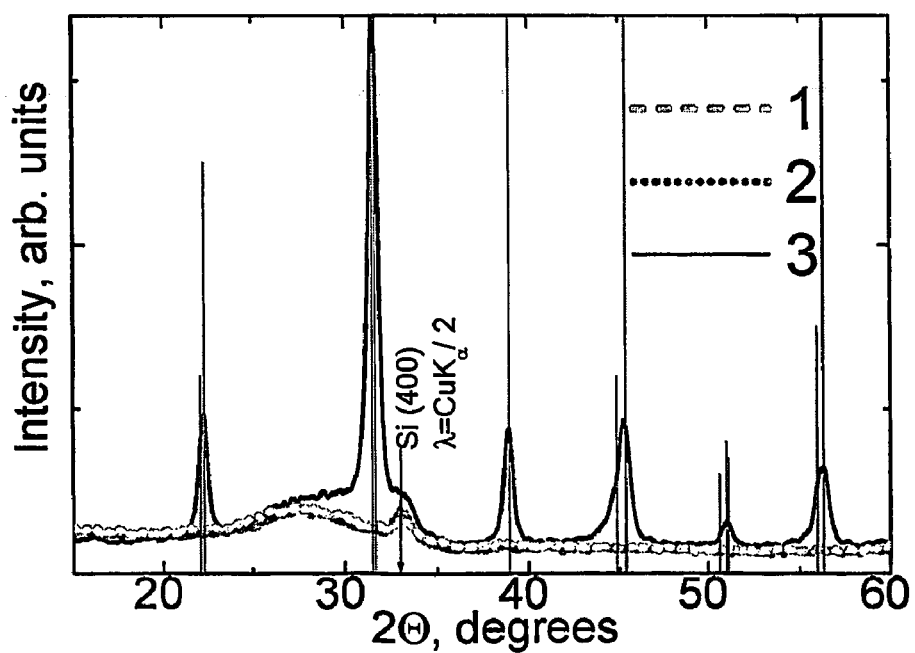
FIG. 2A is the X-Ray diffraction spectra of $BaTiO_3$ films as deposited on (100) Si (1) in comparison to the spectra of the films passed through the temperature gradient (2) and part of the film (1) heated under isothermal conditions (3). The vertical lines correspond to the standard XRD pattern of tetragonal $BaTiO_3$ (ICSD Collection Code 23758).

FIG. 2A illustrates the X-Ray diffraction spectra of $BaTiO_3$ films as deposited on (100) Si (1) in comparison to the spectra of the films passed through the temperature gradient (2) and part of the film (1) heated under isothermal conditions (3). The vertical lines correspond to the standard XRD pattern of tetragonal $BaTiO_3$ (ICSD Collection Code 23758). As shown, X-Ray diffraction (XRD) spectra of the films passed through the temperature gradient are indistinguishable from those of as-deposited films. No XRD peaks apart from those of Si-substrate were observed, indicating the absence of a crystalline phase. The volume detection limit of a crystalline phase by MD calculated from the signal to noise ratio[10] was less than 0.3%.

Figure 2B:
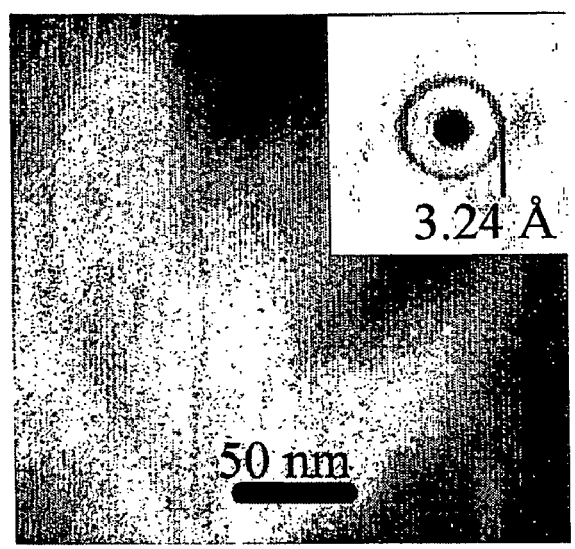
FIG. 2B is the transmission electron microscopy (TEM) image and electron diffraction (ED) pattern of a $BaTiO_3$ film passed through the temperature gradient.

FIG. 2B shows the transmission electron microscopy (TEM) image and electron diffraction (ED) pattern of a $BaTiO_3$ film passed through the temperature gradient. Thus, thorough transmission electron microscopy (TEM) investigation only rarely detected the presence of crystalline grains[11] and the concentration of the crystallites estimated from TEM images was far below 0.3%. In contrast to the similarity with respect to electron and X-ray diffraction analysis, as-deposited films and the films passed through the temperature gradient have distinctly different electrical properties.

Figure 3A:
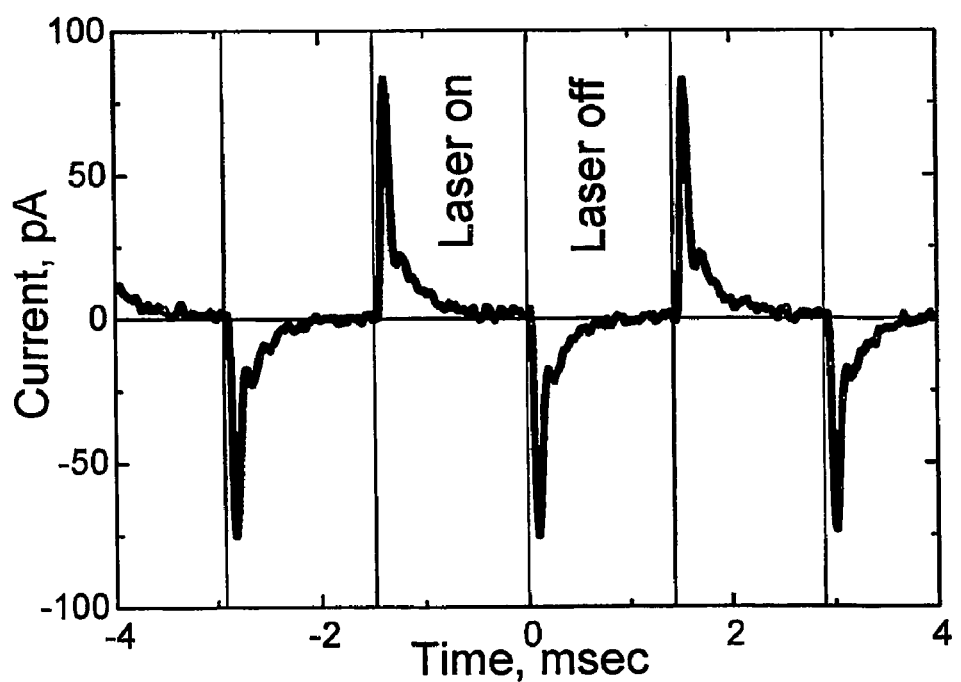
FIG. 3A shows the pyroelectric response of a 182(±10)nm thick amorphous $BaTiO_3$ film passed through the temperature gradient, to periodic heating by an infra-red laser. The Si substrate is 275 μm thick; therefore, constant temperature establishes within αβουτ 0.2 msec after the laser switches on and off.

FIG. 3A shows the pyroelectric response of a 182(±10)nm thick amorphous $BaTiO_3$ film passed through the temperature gradient, to periodic heating by an infra-red laser. The Si substrate is 275 μm thick; therefore, constant temperature establishes within about 0.2 msec after the laser switches on and off. The films passed through the temperature gradient show a large pyroelectric effect $p_{measured}$=(1-3)×10$^{-9}$ C/(cm$^2$×K) (5-15% that of a single crystal of $BaTiO_3$), which remains invariable (±15%) over the temperature range 20-150° C. The time dependence of the electrical current generated by periodical heating has a perfectly symmetric shape, which is a signature for the pyroelectric effect and excludes possible misinterpretations.

It should be noted that asymmetric contacts may cause a thin film with a strong dependence of the dielectric constant on temperature to appear pyroelectric. The apparent pyroelectric coefficient of this false pyroelectricity can be related to the contact potential difference, D, the dielectric constant, ϵ, the temperature coefficient of the dielectric constant, b=1/ϵ×dϵ/dT, and the film thickness, t, as p=Dbϵϵ$_0$/t. ϵ$_0$ denotes dielectric permittivity of vacuum. For the film under consideration this value is order of 10$^{-12}$C/(cm$^2$K), which is three orders of magnitude below the measured values.

The pyroelectric effect was confirmed independently by the continuous temperature ramping technique. The direction of the pyroelectric current indicates that the pyroelectric vector is directed toward the substrate. Application of an external electric field of ±200 kV/cm does not alter the value or the sign of the pyroelectric current, demonstrating that the direction of the pyroelectric vector cannot be changed or reversed (absence of switching).

Figure 3B:
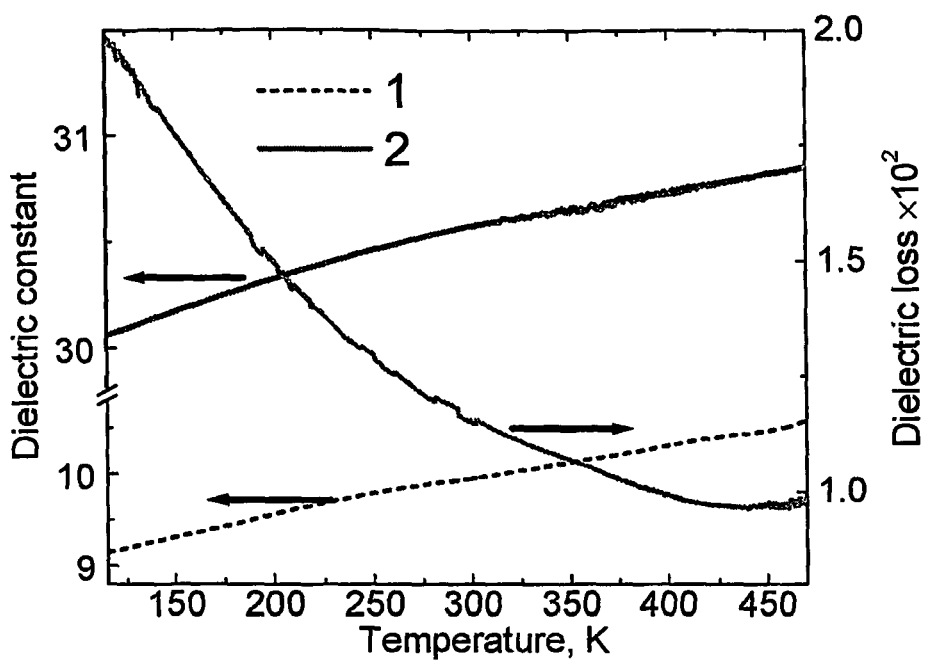
FIG. 3B shows the temperature dependence of the dielectric constant (at 1 kHz) for amorphous $BaTiO_3$ thin film; (1) as-deposited film and (2) amorphous film passed through the temperature gradient.

FIG. 3B shows the temperature dependence of the dielectric constant (at 1 kHz) for amorphous $BaTiO_3$ thin film; (1) as-deposited film and (2) amorphous film passed through the temperature gradient. The dielectric constant was measured by an Alpha dielectric analyzer (Novocontrol Inc.) with sputtered Cr (300 nm) top electrodes. The dielectric constant of the films passed through the temperature gradient increases monotonically with temperature from ≈30(±3%) at 115 K to ≈31(±4%) at 400 K without discontinuities or abrupt slope changes. The dielectric constant shows only minor variations with frequency (<4.5%) in the 1-10$^5$ Hz frequency range and the dielectric loss is less than 0.02. As-deposited $BaTiO_3$ films do not show any signs of pyroelectricity and have a dielectric constant ≈9[12], with no significant temperature dependence (FIG. 3B).

The films passed through the temperature gradient exhibit a piezoelectric effect of magnitude $d_{33}$=10(±50%) pm/V (5-10% of a single crystal of $BaTiO_3$), as measured by the two independent techniques. Pyroelectric and piezoelectric effects comprising 5-15% of the corresponding values for a single crystal cannot be explained by inclusions of crystallites (less than 0.3%) and thus originate from the highly stressed amorphous phase formed in the films passed through the temperature gradient.

The periodic temperature change technique[23,24] with a semiconductor laser as a heatsource[25] and a continuous temperature ramping method[26] were used to determine the film pyroelectric coefficient. Piezoelectric coefficient was evaluated from Piezoelectric Force Microscopy (PFM) data (MMAFM, DI-VEECO)[27]. The measurement was performed using the signal access module to which a sinusoidal voltage was applied to the tip at 5-15 kHz, and the resultant tip response monitored with a lock-in amplifier and by a single path interferometer with a calibrated reference standard (single crystal $LiNbO_3$). For the latter, the sample was indium-soldered to a 5 mm thick copper plate to avoid substrate bending.

Subjecting the films passed once through the temperature gradient to up to three such additional cycles did not alter their properties. Isothermal heating (600° C. 2 hrs, 680° C. 1.5 hrs, 800° C. 20 min.) also leaves their properties unchanged. Above 800° C., the $BaTiO_3$ reacts with Si forming barium silicates[13].

Figures 4A, 4B:
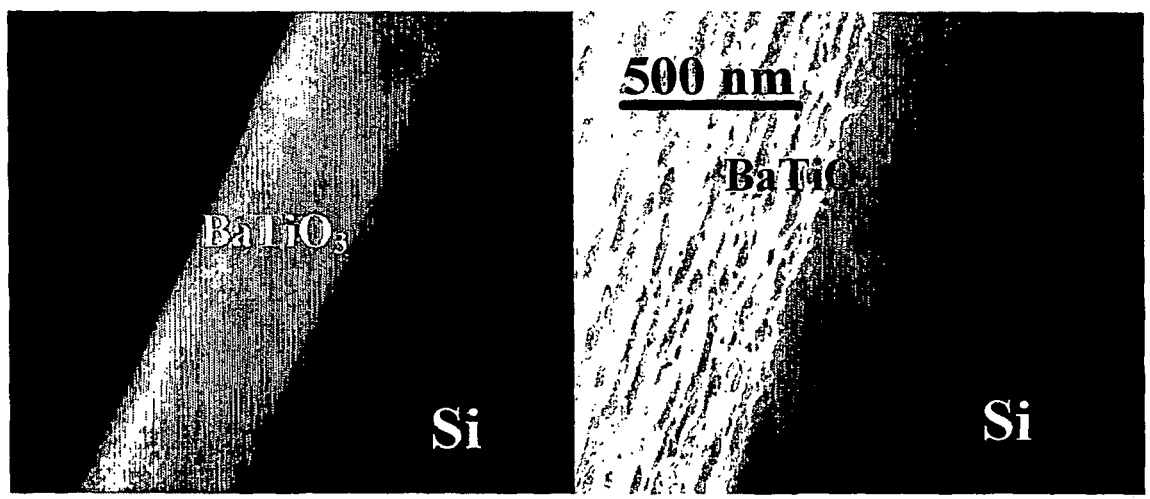
FIGS. 4A and 4B show scanning electron microscopy images (secondary electron mode) of, respectively, an amorphous BaTiO$_3$ thin film passed through the temperature gradient; the other part of the same amorphous films heated in isotermal conditions.

FIGS. 4A and 4B show scanning electron microscopy images (secondary electron mode) of, respectively, an amorphous $BaTiO_3$ thin film passed through the temperature gradient; the other part of the same amorphous films heated in isotermal conditions. In these experiments, the as-deposited $BaTiO_3$ films formed polycrystalline $BaTiO_3$ following isothermal heating for 1 hr at 600° C. The refractive index of these films is quite low $n_\perp=n_\parallel$=1.80÷1.85[14] and the compressive stress of 0.2-0.6 GPa is significantly smaller than that of the films passed through the temperature gradient, as described above. The true pyroelectric effect or stress-induced pyroelectric effect will appear only if the material has no center of symmetry, i.e., the sub-nanocrystalline material has to have an assymetric preferred direction. Thus, the sub-nanocrystalline material has a local order resulting in appearance of spontaneous polarization. The relatively high thermal stability of the sub-nanocrystalline state and its high birefringence ($n\perp - n_\| = -(0.03 \div 0.07)$) can be explained by the short-range, stress-induced dipole ordering, similar to what was earlier observed in crystals[28]. Such effects for anisotropic media were considered in the past[29], however, attempts to produce a clear pyroelectric signature from a nearly disordered material remained illusive[30], giving only indirect evidence of the presence of spontaneous polarization. The experiments conducted by the inventor have shown that short-range dipole ordering in the sub-nanocrystalline material is stress-induced and appears during passing the films through the temperature gradient.

The invention claimed is:

1. A device comprising a substrate and a film coating on said substrate, wherein said film coating comprises a quasi-amorphous pyroelectric compound, said compound comprising:
   a metal, a mixture of metals, or a semi conducting compound lacking spatial periodicity;
   said quasi-amorphous pyroelectric compound being an inorganic oxide compound having piezoelectric properties;
   said quasi-amorphous pyroelectric compound being a product of application of a mechanical strain to a substantially amorphous compound, said mechanical strain being created by passing said film through a steep unidirectional temperature gradient generating a gradient of mechanical strain, said gradient of mechanical strain having one in-plane component along the temperature gradient and one out-of-plane component, said out-of-plane component inducing an irreversible orientation of the molecular grouping due to compressive stress from the in-plane component; said temperature gradient being controlled so as to prevent crystallization of said compound, thereby obtaining highly stressed amorphous films and so that said compound is pyroelectric and has a pyroelectric vector whose direction cannot be changed or reversed, said film being clamped by the substrate creating mechanical constraints, such that volume expansion of said film is restricted.

2. The device of claim 1, wherein said quasi-amorphous compound has the formula (AxB1-x)pOn, wherein A and B are independently selected from transitions metals, elements of Group IVA of the periodic table, alkali metals, alkali earth metals and rare earth metals; x has values of between 0 to 1; p is an integer having the values 1, 2 or 3; and n is an integer having the value of 1, 2, 3 or 4.

3. The device of claim 2, wherein A is a transition metal or an element of Group IVA of the periodic table, x is 1 and p is 2.

4. The device of claim 3, wherein the substrate is selected from Si, SiO2 and glass.

5. The device of claim 4, wherein the quasi-amorphous compound is SiO2.

6. The device of claim 1, wherein said quasi-amorphous compound has the formula $(A_xB_{1-x})(C_yD_{1-y})O_n$ wherein A and B are independently selected from alkali metals, alkali earth metals, rare earth metals and elements of Group IVA of the periodic table; C and D are independently selected from transition metals and alkali earth metals; x and y have values of between 0 to 1; and n is an integer having the value of 1, 2 or 3.

7. The device of claim 6, wherein A and B are independently selected from Ba, Sr, Ca, Pb, La, Eu, Li, Na, K and Cs; C and D are independently selected from Ti, Zr, Nb, Ta, Sc, Mg and V; and n is 3.

8. The device of claim 7, wherein A and B are independently selected from Ba, Sr, Ca, Pb, La and Eu.

9. The device of claim 8, wherein C and D are independently selected from Ti and Zr.

10. The device of claim 8, wherein C and D are independently selected from Nb, Ta and V.

11. The device of claim 7, wherein A and B are independently selected from Li, Na, K and Cs.

12. The device of claim 11, wherein C and D are independently selected from Ti and Zr.

13. The device of claim 11, wherein C and D are independently selected from Nb, Ta and V.

14. The device of claim 7, wherein C and D are independently selected from Ti and Zr.

15. The device of claim 7, wherein C and D are independently selected from Nb, Ta, Sc, Mg and V.

16. The device of claim 7, wherein said compound forms an acoustic wave propagation element.

17. The device of claim 6, wherein y=0 and the quasi amorphous compound has the formula $(A_xB_{1-x})DO_3$, and is an inorganic compound.

18. The device of claim 17, wherein the quasi-amorphous compound has a pyroelectric coefficient of between about $10^{-12}$ C/(cm$^2$×K) and about $10^{-7}$ C/(cm$^2$×K).

19. The device of claim 6, wherein the quasi-amorphous compound has a pyroelectric coefficient of between about $10^{-12}$ C/(cm$^2$×K) and about $10^{-7}$ C/(cm$^2$×K).

20. The device of claim 6, wherein the quasi-amorphous compound is selected from BaTiO$_3$, CaTiO$_3$, PbTiO$_3$, Pb(ZrTi)O$_3$, Pb(Zr$_{0.35}$Ti$_{0.65}$)O$_3$, (PbCa)TiO$_3$, (PbLa)(ZrTi)O$_3$, PbLaTiO$_3$, Pb(ScTa)O$_3$, Pb(ScNb)O$_3$, Pb(MgNb)O$_3$, SrTiO$_3$, (Sr$_{0.65}$,Ba$_{0.35}$)TiO$_3$, (Ba$_{0.70}$,Sr$_{0.30}$)TiO$_3$ and EuTiO$_3$.

21. The device of claim 20, wherein the quasi-amorphous compound has a pyroelectric coefficient of between about $10^{-12}$ C/(cm$^2$×K) and about $10^{-7}$ C/(cm$^2$×K).

22. The device of claim 21, wherein the quasi-amorphous compound is BaTiO$_3$.

23. The device of claim 20, wherein the quasi-amorphous compound is selected from BaTiO$_3$, PbTiO$_3$ and SrTiO$_3$.

24. The device of claim 6, wherein the substrate is selected from Si, SiO$_2$ and glass.

25. The device of claim 24, wherein the thickness of the coating layer is below 0.5 micron.

26. The device of claim 6, operable as a sensor for sensing an external field including at least one of the following: temperature field, magnetic field and electric field.

27. The device of claim 6, wherein said compound forms an acoustic wave propagation element.

28. The device of claim 6, wherein said compound comprises a birefringent medium.

29. The device of claim 1, operable as a sensor for sensing an external field including at least one of the following: temperature field, magnetic field and electric field.

30. The device of claim 1, wherein said compound forms an acoustic wave propagation element.

31. The device of claim 1, wherein said compound comprises a birefringent medium.

32. The device of claim 1, wherein the quasi-amorphous pyroelectric compound is a non-crystalline ionic solid having macroscopic polarization.

33. The device of claim 1, wherein said film is clamped by the substrate, such that volume expansion of said film is restricted.

34. The device comprising a substrate and a film coating on said substrate, wherein said film coating comprises an inorganic quasi-amorphous compound of the formula (AxB1-x)(CyD1-y)O3,
- wherein A and B are independently selected from alkali metals, alkali earth metals, rare earth metals and elements of Group IVA of the periodic table;
- C and D are independently selected from transition metals and alkali earth metals;
- x and y have values of between 0 to 1;
- lacking spatial periodicity; and
- wherein said compound is a product of applying a mechanical strain to a substantially amorphous compound of the formula (AxB1-x)(CyD1-y)On wherein n is an integer having the value of 1, 2 or 3, said mechanical strain being controlled so as to prevent crystallization of said compound, thereby obtaining inorganic quasi-amorphous compound having pyroelectric properties and so that said compound has a pyroelectric vector whose direction cannot be changed or reversed.

35. The device of claim 34, wherein said film is clamped by the substrate, such that volume expansion of said film is restricted.

36. A device comprising a substrate and a film coating on said substrate, wherein said film coating comprises a quasi-amorphous pyroelectric compound comprising a metal, a mixture of metals, or a semiconducting compound lacking spatial periodicity;
   a. said quasi-amorphous pyroelectric compound being an inorganic oxide compound having piezoelectric properties, said pyroelectric compound being in the form of a film;
   b. said quasi-amorphous pyroelectric compound being produced by applying a mechanical strain to a substantially amorphous compound being sputtered on said substrate;, said mechanical strain comprising passing said film through a steep unidirectional temperature gradient generating a gradient of mechanical strain, said strain gradient having one in-plane component along the temperature gradient and one out-of-plane component, said out-of-plane component inducing an irreversible orientation of the molecular grouping due to compressive stress from the in-plane component; and
   c. said temperature gradient being controlled so as to prevent crystallization of the amorphous compound, thereby obtaining highly stressed amorphous films, and so that said compound is pyroelectric and has a pyroelectric vector whose direction cannot be changed or reversed.

37. The device of claim 36, wherein said film is clamped by the substrate, such that volume expansion of said film is restricted.

38. A device comprising a substrate and a film coating on said substrate, wherein said film coating comprises a quasi-amorphous pyroelectric compound comprising a metal, a mixture of metals, or a semiconducting compound lacking spatial periodicity;
   a. said quasi-amorphous pyroelectric compound being an inorganic oxide compound having piezoelectric properties;
   b. said pyroelectric compound being a produced by applying a mechanical strain to a substantially amorphous compound;
   c. said pyroelectric compound being made of a material having an asymmetric preferred direction;
   d. said piezoelectric properties being stress induced dipole ordering; and
   e. said mechanical strain being controlled so as to prevent crystallization of said compound, and so that said compound is pyroelectric and has a pyroelectric vector whose direction cannot be changed or reversed.

* * * * *